United States Patent
Koh

(10) Patent No.: US 6,960,508 B2
(45) Date of Patent: Nov. 1, 2005

(54) MOS TRANSISTOR AND METHOD OF MANUFACTURING THE SAME

(75) Inventor: Kwan-Ju Koh, Bucheon (KR)

(73) Assignee: DongbuAnam Semiconductor Inc., Seoul (KR)

( * ) Notice: Subject to any disclaimer, the term of this patent is extended or adjusted under 35 U.S.C. 154(b) by 0 days.

(21) Appl. No.: 10/915,818

(22) Filed: Aug. 10, 2004

(65) Prior Publication Data

US 2005/0035378 A1 Feb. 17, 2005

(30) Foreign Application Priority Data

Aug. 12, 2003 (KR) .................................. 10-2003-0055788

(51) Int. Cl.[7] ............................................. H01L 21/336
(52) U.S. Cl. ....................... 438/270; 438/268; 438/272; 438/283; 438/296
(58) Field of Search ................................. 438/206, 212, 438/268, 270, 272, 279, 283, 294, 296; 257/329, 330, 331, 332, 334

(56) References Cited

U.S. PATENT DOCUMENTS

| | | | |
|---|---|---|---|
| 5,719,067 A | | 2/1998 | Gardner et al. |
| 5,888,868 A | | 3/1999 | Yamazaki et al. |
| 5,940,707 A | | 8/1999 | Gardner et al. |
| 6,501,129 B2 | * | 12/2002 | Osawa ........................ 257/330 |
| 6,548,856 B1 | | 4/2003 | Lin et al. |
| 6,635,924 B1 | | 10/2003 | Hergenrother et al. |
| 2001/0024858 A1 | * | 9/2001 | Schulz et al. ................ 438/268 |
| 2002/0158287 A1 | * | 10/2002 | Fujishima et al. ........... 257/330 |
| 2005/0029575 A1 | * | 2/2005 | Chu et al. .................... 257/314 |

* cited by examiner

Primary Examiner—Ngân V. Ngô
(74) Attorney, Agent, or Firm—Andrew D. Fortney

(57) ABSTRACT

An object of the present invention is to provide a MOS transistor of a new structure and a method of manufacturing the same that is capable of easily fabricating a high integration density device by overcoming photolithography limitations. The object of the present invention is accomplished by a MOS transistor, including a semiconductor substrate having a projection in which the width of an upper portion thereof is larger than that of a lower portion thereof; an isolating layer formed in the middle of substrate of the projection; first and second drain regions formed within the surface of the substrate of the projection; first and second source regions formed within the surface of the substrate on both sides of the projection; a gate insulating layer formed on the entire surface of the substrate; and first and second gates formed on the gate insulating layer on both sides of the substrate of the projection.

10 Claims, 5 Drawing Sheets

MOS TRANSISTOR AND METHOD OF MANUFACTURING THE SAME

BACKGROUND OF THE INVENTION (a) Field of the Invention

The present invention relates to a semiconductor device and a method of manufacturing the same, and more particularly to a MOS transistor and a method of manufacturing the same.

(b) Description of the Related Art

Generally, a Metal Oxide Silicon (MOS) transistor has a gate insulating layer formed on a semiconductor substrate, a gate formed on the insulating layer, and source and drain regions formed within the substrate on both sides of the gate. Various manufacturing methods of this transistor are disclosed in U.S. Pat. Nos. 6,635,924, 6,548,856, 5,940,707, 5,888,868, and 5,719,067.

A conventional MOS transistor will be described with reference to FIG. 1.

As shown in FIG. 1, a gate insulating layer 11 and a gate 12 of a polysilicon are sequentially formed on a semiconductor substrate 10, and lightly doped drain (LDD) regions 13a and 13b being formed of low concentration impurities are formed within the substrate 10 on both sides of the gate 12. A spacer 14 is formed on the sidewall of the gate 12, and source and drain regions 15a and 15b being formed of high concentration impurities are formed within the substrate 10 on both sides of the spacer 14.

In this MOS transistor, in the case a voltage of more than a threshold voltage is applied to the gate 12, charge carriers flow from the source region 15a to the drain region 15b, so that a channel is horizontally formed within the substrate 10 below the gate 12.

Recently, for the purpose of achieving a high integration density device, the channel length below the gate 12 has been decreased, and the source and drain regions 15a and 15b have been formed with shallow junctions, so as to prevent a short channel effect due to the decrease of the channel length.

However, in the conventional MOS transistor as described above, if the channel length decreases to for example nano size, there is a problem in that it is difficult to form an ultra fine gate of the nano size and source and drain region of the shallow junctions by conventional manufacturing processes due to photolithography limitations.

Accordingly, to form the ultra fine gate and source and drain region of the shallow junctions, new pattern techniques, such as electron beam and X line exposure methods must be applied to fabricating the MOS transistor, but it is impossible to mass-produce ultra fine devices using these techniques, as these techniques are not fully established.

Furthermore, for the purpose of achieving a high integration density device, devices of novel structures have been developed, but it is difficult to fabricate these devices.

SUMMARY OF THE INVENTION

An object of the present invention is to provide a MOS transistor of a new structure that is capable of easily fabricating a high integration density device by overcoming photolithography limitations. Another object of the present invention is to provide a method of manufacturing the MOS transistor described above.

The object of the present invention as noted above is accomplished by a MOS transistor, including a semiconductor substrate having a projection in which the width of an upper portion thereof is larger than that of a lower portion thereof; an isolating layer formed in the middle of substrate of the projection; first and second drain regions formed within the surface of the substrate of the projection; first and second source regions formed within the surface of the substrate on both sides of the projection; a gate insulating layer formed on the entire surface of the substrate; and first and second gates formed on the gate insulating layer on both sides of the substrate of the projection.

Furthermore, the object of the present invention as noted above is accomplished by a method of manufacturing a MOS transistor, including forming an isolating layer in a semiconductor substrate; forming first and second drain regions in the surface of the substrate on both sides of the isolating layer; etching the portions of the first and second drain regions and the substrate on both sides of the isolating layer to form a projection having the isolating layer in its middle; forming a spacer on the sidewalls of the substrate of the projection; forming a barrier layer on the surfaces of the first and second drain regions and of the substrate on both sides of the projection; selectively removing the spacer; forming first and second recesses by etching the substrate exposed by the barrier layer; removing the barrier layer; forming a gate insulating layer on the entire surface of the substrate; forming first and second source regions within the surface of the substrate on both sides of the projection; depositing a gate material layer on the gate insulating layer so as to fill the first and second recesses; and forming first and second gates on the gate insulating layer on both sides of the substrate of the projection by patterning the gate material layer.

DETAILED DESCRIPTION OF THE PREFERRED EMBODIMENTS

Figure 1:
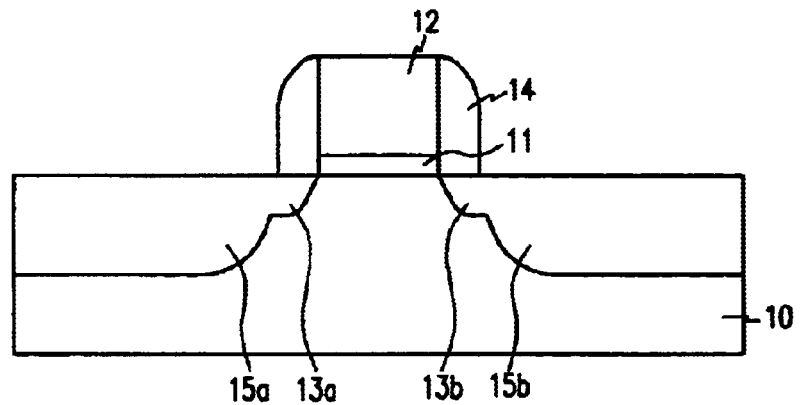
FIG. 1 is a cross-sectional view showing a conventional MOS transistor.

The present invention will now be described more fully hereinafter with reference to the accompanying drawings, in which a preferred embodiment of the invention is shown. The present invention may, however, be embodied in many different forms, and should not be construed as being limited to the embodiment set forth herein.

First, a MOS transistor according to an embodiment of the present invention will be described with reference to FIG. 2 and FIG. 3G.

As shown in the drawings, a projection 100 is formed in a semiconductor substrate 20. The projection 100 has a T type structure in which the width of an upper portion is larger than that of a lower portion. A deep trench type isolating layer 21 is formed in the middle of the substrate 20 of the projection 100. The depth of the isolating layer 21 is larger than the height of the projection 100. First and second drain regions 22a and 22b are formed within the surface of the substrate 20 of the projection 100 on both sides of the isolating layer 21, and first and second source regions 26a and 26b are formed within the surface of the substrate 20 on both sides of the projection 100. A gate insulating layer 25 is formed on the entire surface of the substrate 20, and first and second gates 27a and 27b are formed on the gate insulating layer 25 on both sides of the substrate 20 of the projection 100. Contact portions C for electrically connecting to interconnection lines are respectively formed on the drain regions 22a and 22b, the source regions 26a and 26b, and the gates 27a and 27b.

In the MOS transistor as described above, in the case voltages of more than a threshold voltage are respectively applied to the gates 27a and 27b, charge carriers flow from the source regions 26a and 26b to drain regions 22a and 22b, so that channels are respectively formed vertically within the substrate 20 of the protection 100 adjacent to the gates 27a and 27b.

At this time, the currents flowing to the drain regions 22a and 22b can be respectively controlled by respectively controlling the voltages applied to the gates 27a and 27b. For example, in the case a voltage of more than threshold voltage is applied to the first gate 27a and a voltage of less than the threshold voltage is applied to the second gate 27b, a current flowing to the first drain region 22a is passed and a current flowing to the second drain region 22b is cut off.

Next, a method of manufacturing the above MOS transistor will be described with reference to FIGS. 3A–3G.

Figure 3A:
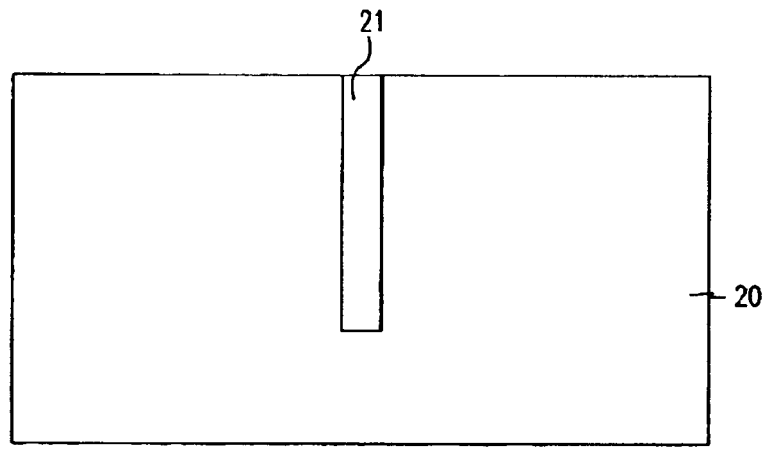
FIGS. 3A–3G are cross-sectional views for describing a method of manufacturing a MOS transistor according to an embodiment of the present invention.

Referring to FIG. 3A, a deep trench type isolating layer 21 having a high aspect ratio is formed in a semiconductor substrate 20.

The deep trench type isolating layer 21 is formed by performing an oxidation process after deeply implanting impurity ions into the substrate 20 of an isolating region using a Plasma Immerse Ion Implant (PIII) technique. Thus, in the case the impurities are implanted into the isolating region of the substrate 20, oxidation is preformed relatively quickly at the isolating region, so that the deep trench type isolating layer 21 can be selectively formed at the isolating region of the substrate 20.

Furthermore, for the purpose of easily obtaining a Critical Dimension (CD) of the deep trench, the deep trench type isolating layer 21 is formed by forming a nitride layer pattern (not shown) on the substrate 20, forming a spacer on the sidewall of the nitride layer pattern, and etching the substrate 20 using the nitride pattern and the spacer as a hard mask.

Figure 3B:
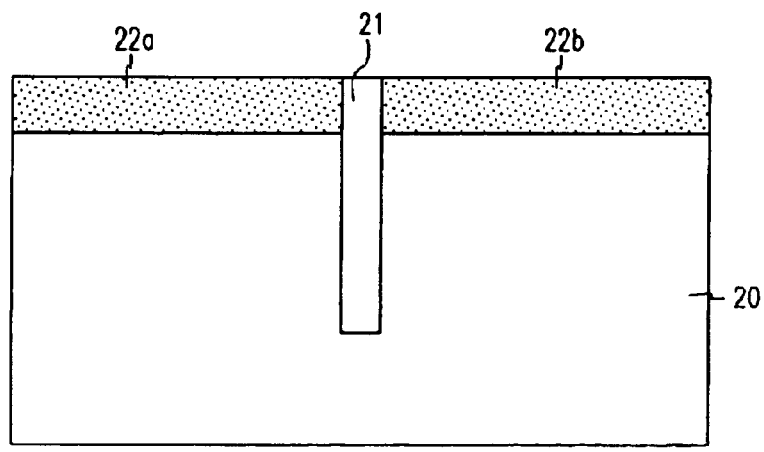

Referring to FIG. 3B, first and second drain regions 22a and 22b are formed within the surface of the substrate 20 on both sides of the isolating layer 21 by ion-implanting impurities into the substrate 20.

Figure 3C:
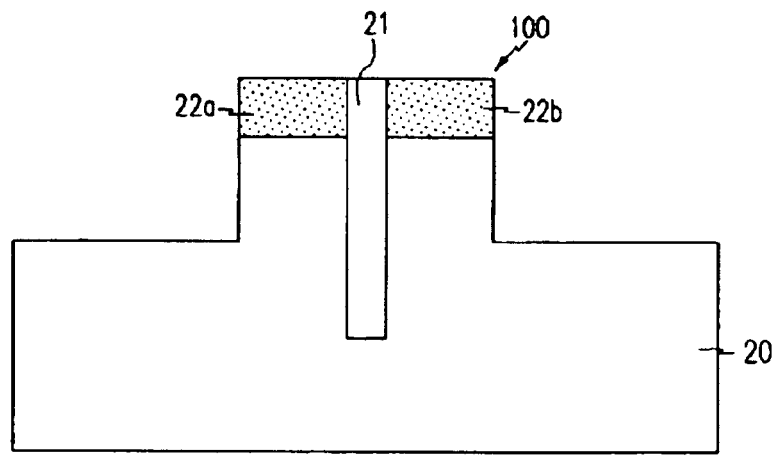

Referring to FIG. 3C, the portions of the first and second drain regions 22a and 22b and the substrate on both sides of the isolating layer 21 are etched by photolithography and an etching process, so that projection 100 having the isolating layer 21 in its middle is formed. At this time, the etching depth is adjusted to a depth being shallower than the isolating layer 21 so as to separate the substrate 20 of the projection 100 by the isolating layer 21.

Figure 3D:
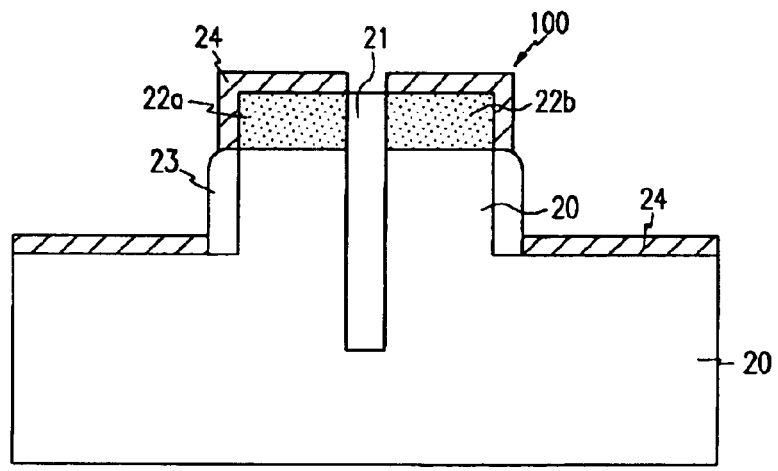

Referring to FIG. 3D, a nitride layer is deposited on the entire surface of the substrate 20 and is etched so as to expose the substrate 20 on both sides of the projection 100, thereby forming a spacer 23 of the nitride layer on the sidewall of the substrate 20 of the projection 100. Thereafter, a metal layer of cobalt (Co) or titanium (Ti) is deposited on the entire surface of the substrate 20 and a silicide process is then performed, to form silicide layer 24 on the surfaces of the first and second drain regions 22a and 22b and of the substrate 20 on both sides of the projection 100. The metal layer not reacting at the silicide process is then removed.

Figure 3E:
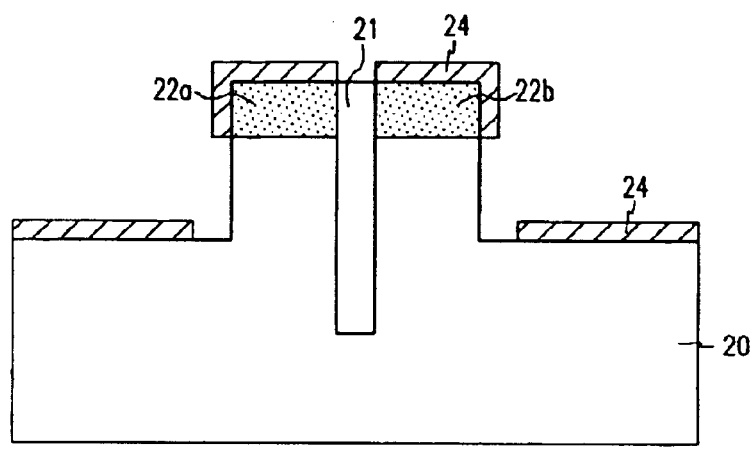

Referring to FIG. 3E, the spacer 23 is selectively removed by wet etching using the silicide layer 24 as an etching barrier.

Figure 3F:
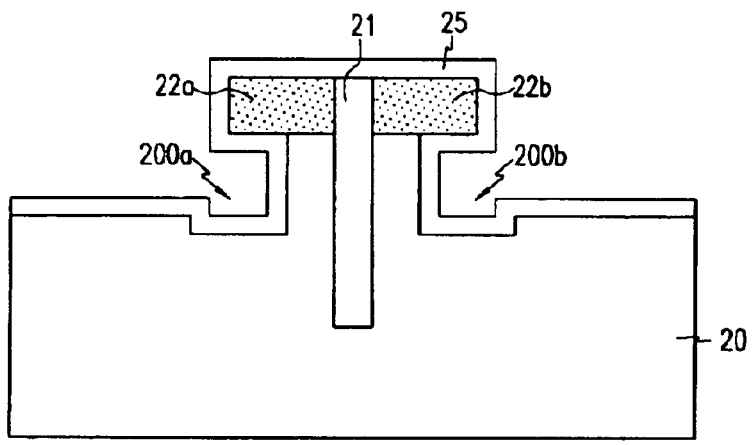

Referring to FIG. 3F, the substrate 20 exposed by the silicide layers 24 is etched by isotropic etching, to form first and second recesses 200a and 200b. As a result, the projection 100 has a T type structure in which the width of an upper portion is larger than that of a lower portion. At this time, the isotropic etching is performed by wet etching or dry etching. In the case of dry etching, it is preferred to inject etch gas at the angle of inclination to the substrate 20. Thereafter, the silicide layer 24 is removed, and a gate insulating layer 25 is then formed on the entire surface of the substrate.

Figure 3G:
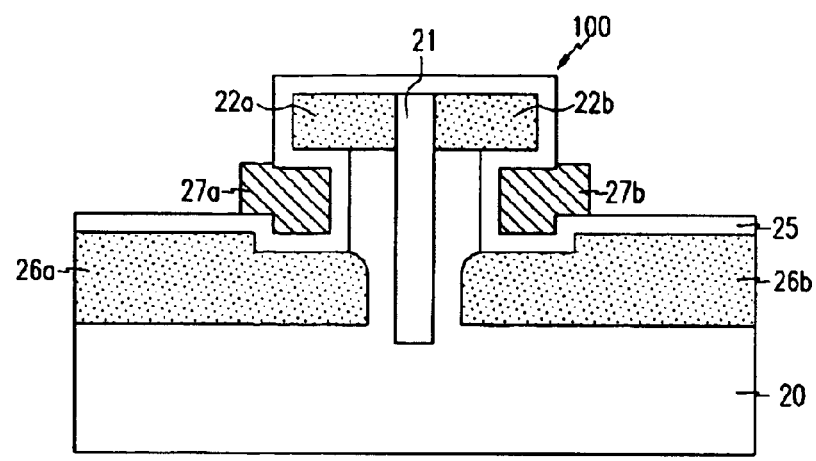

Referring to FIG. 3G, first and second source regions 26a and 26b are formed within the surface of the substrate 20 on both sides of the projection 100 by ion-implanting impurities into the substrate 20. Then, a polysilicon layer as a gate material is deposited on the entire surface of the substrate so as to fill the first and second recesses 200a and 200b, and is patterned by photolithography and an etching process, to form first and second gates 27a and 27b on the gate insulating layer on both sides of the substrate 20 of the projection 100.

Figure 2:
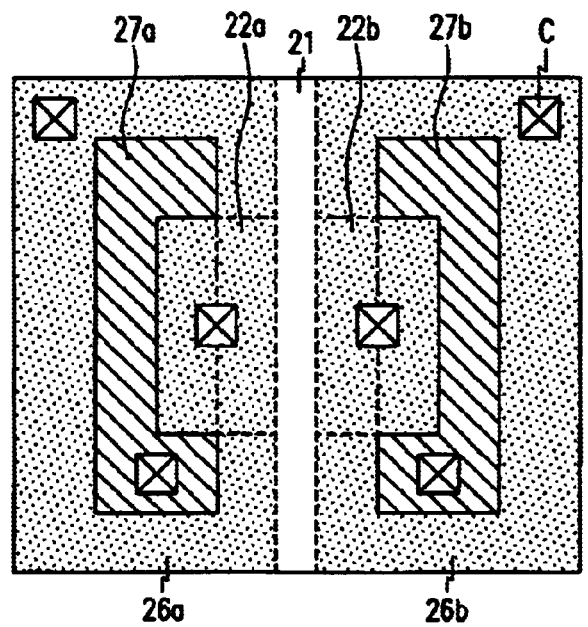
FIG. 2 is a planar view showing a MOS transistor according to an embodiment of the present invention.

Thereafter, as shown in FIG. 2, contact portions C for electrically connecting to interconnection lines are respectively formed on the drain regions 22a and 22b, the source regions 26a and 26b, and the gates 27a and 27b.

In the present invention as described above, two MOS transistors of which channels are respectively formed vertically, are formed in the substrate by projecting the portion of the substrate and forming the deep trench type isolating layer in the middle of the projection.

Therefore, the present invention has an advantage in that each of photolithography processes for patterning the gates of the two MOS transistors and the projection can be performed with twice the device line width.

Furthermore, the present invention has another advantage in that the source and drain regions of the two MOS transistors can be formed with shallow junctions without performing a photolithography process.

As a result, the present invention can overcome photolithography limitations, so that it can easily fabricate a high integration density device.

While the present invention has been described in detail with reference to the preferred embodiments, it is to be understood that the invention is not limited to be disclosed embodiments, but, on the contrary, is intended to cover various modifications and equivalent arrangements included within the spirit and scope of the appended claims.

What is claimed is:

1. A method of manufacturing a MOS transistor, comprising:

forming an isolating layer in a semiconductor substrate;

forming first and second drain regions in the surface of the substrate on both sides of the isolating layer;

etching the portions of the first and second drain regions and the substrate on both sides of the isolating layer to form a projection having the isolating layer in its middle;

forming a spacer on the sidewalls of the substrate of the projection;

forming a barrier layer on the surfaces of the first and second drain regions and of the substrate on both sides of the projection; selectively removing the spacer;

forming first and second recesses by etching the substrate exposed by the barrier layer;

removing the barrier layer;

forming a gate insulating layer on the entire surface of the substrate;

forming first and second source regions within the surface of the substrate on both sides of the projection;

depositing a gate material layer on the gate insulating layer so as to fill the first and second recesses; and forming first and second gates on the gate insulating layer on both sides of the substrate of the projection by patterning the gate material layer.

2. The method of claim 1, wherein the isolating layer is a deep trench type.

3. The method of claim 2, wherein the depth of the isolating layer is larger than the height of the projection.

4. The method of claim 1, wherein the spacer is formed of a nitride layer.

5. The method of claim 4, wherein the spacer is removed by wet etching.

6. The method of claim 1, wherein the barrier layer is formed of a silcide layer.

7. The method of claim 1, wherein the etching is performed by isotropic etching at the forming of the first and second recesses.

8. The method of claim 7, wherein the isotropic etching is performed by wet etching or dry etching.

9. The method of claim 8, wherein the dry etching is performing by injecting etch gas at the angle of inclination to the substrate.

10. The method of claim 1, wherein the gate material layer is formed of a polysilicon layer.

* * * * *